(12) United States Patent
He (10) Patent No.: US 12,356,824 B2
(45) Date of Patent: Jul. 8, 2025

(54) DISPLAY PANEL CONTAINING SUB-PIXEL IN THE SHAPE OF RIGHT ANGLE WITH EQUAL SIDES AND METHOD FOR PREPARING THE SAME

(71) Applicant: TCL China Star Optoelectronics Technology Co., Ltd., Guangdong (CN)

(72) Inventor: Chao He, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/622,071

(22) PCT Filed: Dec. 9, 2021

(86) PCT No.: PCT/CN2021/136836
§ 371 (c)(1),
(2) Date: Dec. 22, 2021

(87) PCT Pub. No.: WO2023/092678
PCT Pub. Date: Jun. 1, 2023

(65) Prior Publication Data
US 2024/0298492 A1    Sep. 5, 2024

(30) Foreign Application Priority Data

Nov. 23, 2021  (CN) .......................... 202111393320.4

(51) Int. Cl.
*H10K 59/35*    (2023.01)
*H10K 71/13*    (2023.01)

(52) U.S. Cl.
CPC ........ *H10K 59/353* (2023.02); *H10K 71/135* (2023.02)

(58) Field of Classification Search
CPC .................................................. H10K 59/353
See application file for complete search history.

(56) References Cited

U.S. PATENT DOCUMENTS

| 2005/0151462 A1* | 7/2005 | Miyagawa | ........... H10K 59/353 |
| | | | 313/500 |
| 2014/0197396 A1* | 7/2014 | Madigan | .............. H10K 50/818 |
| | | | 438/34 |

(Continued)

FOREIGN PATENT DOCUMENTS

| CN | 107731871 A | * | 2/2018 | ......... H01L 27/3246 |
| CN | 107945738 A | | 4/2018 | |

(Continued)

*Primary Examiner* — Peter Bradford
(74) *Attorney, Agent, or Firm* — Nathan & Associates Patent Agents Ltd.; Menachem Nathan (57) ABSTRACT

A display panel and a method for preparing the same are provided. The display panel in the present disclosure includes: a base layer, a plurality of cofferdams, and a plurality of sub-pixels. In the present disclosure, a geometric figure of each sub-pixel is designed into the shape of a right angle with equal sides, so that when an arrangement direction of nozzles is parallel to any right-angle side of the sub-pixel, an inkjet printing device can perform printing, to improve adaptability between the sub-pixels and the inkjet printing device and reduce difficulty in printing of the sub-pixels.

10 Claims, 6 Drawing Sheets

(56) References Cited

U.S. PATENT DOCUMENTS

| | | | | |
|---|---|---|---|---|
| 2015/0279911 | A1* | 10/2015 | Park | H10K 50/11 |
| | | | | 257/89 |
| 2016/0211311 | A1* | 7/2016 | Sato | H10K 59/38 |
| 2016/0276421 | A1 | 9/2016 | Lee et al. | |
| 2016/0284766 | A1* | 9/2016 | Wang | H10K 59/353 |
| 2017/0005151 | A1* | 1/2017 | Kim | H10K 59/353 |
| 2018/0269268 | A1* | 9/2018 | Cai | H10K 59/353 |
| 2018/0350888 | A1* | 12/2018 | Huo | H10K 59/122 |
| 2020/0058713 | A1* | 2/2020 | Zhang | H10K 59/353 |
| 2020/0194520 | A1* | 6/2020 | Seo | H10K 59/353 |
| 2020/0212124 | A1* | 7/2020 | Shao | H10K 59/122 |
| 2021/0057394 | A1* | 2/2021 | Abe | H01L 33/46 |
| 2021/0335907 | A1* | 10/2021 | Xie | H10K 71/00 |
| 2021/0351246 | A1* | 11/2021 | Ren | H10K 59/352 |
| 2022/0157897 | A1* | 5/2022 | Dou | H10K 59/352 |
| 2022/0271108 | A1* | 8/2022 | Luo | H10K 77/10 |

FOREIGN PATENT DOCUMENTS

| | | | | |
|---|---|---|---|---|
| CN | 108198514 A | | 6/2018 | |
| CN | 108511493 A | * | 9/2018 | |
| CN | 108598140 A | * | 9/2018 | |
| CN | 110993665 A | * | 4/2020 | G02F 1/1333 |
| CN | 111584553 A | | 8/2020 | |
| CN | 111883559 A | | 11/2020 | |

* cited by examiner

DISPLAY PANEL CONTAINING SUB-PIXEL IN THE SHAPE OF RIGHT ANGLE WITH EQUAL SIDES AND METHOD FOR PREPARING THE SAME

FIELD OF INVENTION

The present disclosure relates to the field of display technologies, and in particular, to a display panel and a method for preparing the same.

BACKGROUND OF INVENTION

An organic light-emitting diode (OLED for short) is an organic thin-film electroluminescent device. The OLED has the advantages such as easy formation of flexible structures, wide viewing angle, low voltage requirement, high power saving efficiency, fast response, light weight, thin thickness, simple construction, low costs, nearly infinite high contrast, relatively low power consumption, and extremely high reaction speed and has become one of the most important display technologies currently.

Display panels are further refined, and an inkjet printing design faces greater challenges due to a higher precision requirement and a smaller inkjet volume. To improve utilization of a substrate, a multi model group (MMG) technology is usually used for a conventional substrate design, i.e., two types of display panels of different sizes are designed on the same substrate by mixing.

Technical Problem

Different arrangement directions of display panels of different sizes easily lead to different arrangement directions of sub-pixels. A scanning direction of a nozzle should be perpendicular to a long-side direction of the sub-pixel during printing. If the scanning direction of the nozzle is parallel to the long-side direction of the sub-pixel, low printing efficiency is caused or printing cannot be performed due to printing precision, etc.

Figure 1:
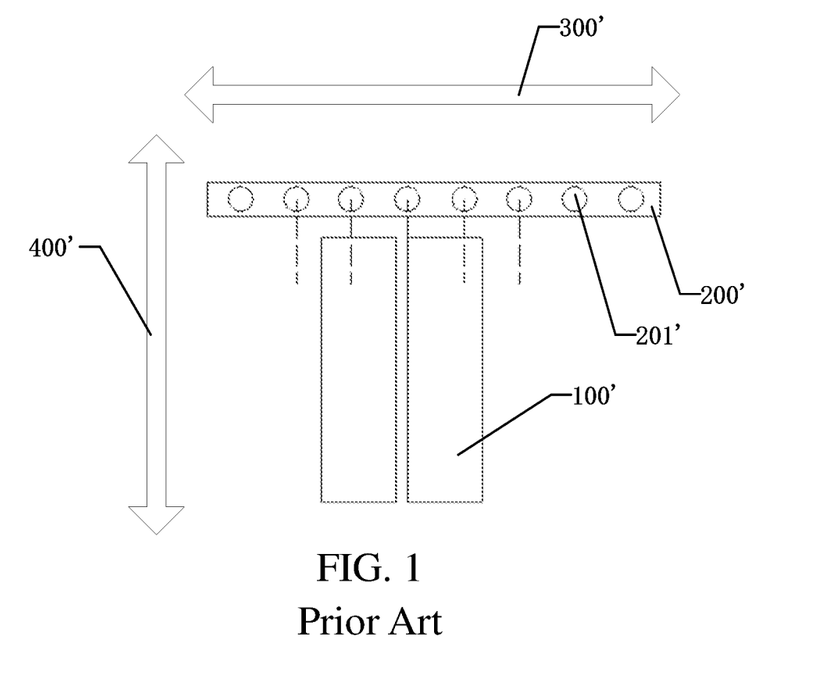
FIG. 1 is a schematic diagram when an arrangement direction of nozzles is parallel to a short side of a sub-pixel in the prior art.

As shown in FIG. 1, a plurality of nozzles 201' arranged in a row are generally disposed on an inkjet printing device 200', and then the inkjet printing device moves in a scanning direction 400' perpendicular to an arrangement direction 300' of the nozzles, to print ink in a plurality of sub-pixels 100' simultaneously by using the plurality of nozzles 201'.

As shown in FIG. 1, the conventional sub-pixel 100' is generally rectangular. When the arrangement direction 300' of the nozzles is parallel to a short side of the sub-pixel 100', the inkjet printing device 200' has low printing efficiency and even cannot perform printing effectively due to a relatively small length of the short side of the sub-pixel 100'. Therefore, the inkjet printing device 200' requires to be rotated, to cause the arrangement direction 300' of the nozzles to be parallel to a long side of the sub-pixel 100' for printing. As a result, when arrangement directions of the sub-pixels 100' are different, the inkjet printing device 200' requires to be rotated to perform secondary printing, causing low production efficiency and affecting an overall output greatly.

SUMMARY OF INVENTION

Technical Solution

An objective of the present disclosure is to provide a display panel and a method for preparing the same, which can resolve a problem such as low production efficiency because an inkjet printing device requires to be rotated when sub-pixels in different arrangement directions are printed in the prior art.

To resolve the problem, the present disclosure provides a display panel, including: a base layer: a plurality of cofferdams, disposed on the base layer; and a plurality of sub-pixels, disposed on the base layer in the cofferdams and being in a one-to-one correspondence with the cofferdams, wherein a geometric figure of each of the sub-pixels is in the shape of a right angle with equal sides, and geometric figures of any two of the sub-pixels are congruent geometric figures: in a first direction, a geometric figure obtained after any one of the sub-pixels is translated coincides with a geometric figure of a next sub-pixel adjacent to the sub-pixel; in a second direction perpendicular to the first direction, a geometric figure obtained after any one of the sub-pixels is rotated by 180° Coincides with a geometric figure of a next sub-pixel adjacent to the sub-pixel: and each of the sub-pixels includes a plurality of display regions, and a shape of an arrangement geometric figure of the display regions in any one of the sub-pixels is same as a shape of a geometric figure of the sub-pixel in which the display regions are located.

Further, geometric figures of any two of the display regions located in the same sub-pixel are congruent geometric figures.

Further, any two of the display regions located in the same sub-pixel have the same color.

Further, the sub-pixels include: a first sub-pixel, including three first display regions: a second sub-pixel, including three second display regions; and a third sub-pixel, including three third display regions: and colors of the first display regions, the second display regions, and the third display regions are different from each other.

Further, the first display regions, the second display regions, and the third display regions are respectively red display regions, green display regions, and blue display regions.

Further, in the first direction, sub-pixels in each column are arranged in a sequence of the first sub-pixel, the second sub-pixel, and the third sub-pixel: and in the second direction, sub-pixels in a $(3n+1)^{th}$ row are arranged in a sequence of the first sub-pixel and the second sub-pixel, sub-pixels in a $(3n+2)^{th}$ row are arranged in a sequence of the second sub-pixel and the third sub-pixel, and sub-pixels in a $(3n+3)^{th}$ row are arranged in a sequence of the third sub-pixel and the first sub-pixel, wherein n is greater than or equal to 0.

Further, in the first direction, sub-pixels in each column are arranged in a sequence of the first sub-pixel, the second sub-pixel, and the third sub-pixel; and in the second direction, sub-pixels in each row are arranged in a sequence of the first sub-pixel, the second sub-pixel, and the third sub-pixel.

Further, one first display region, one second display region, and one third display region form one valid pixel unit, and a geometric figure of the valid pixel unit is in the shape of a right angle with equal sides.

To resolve the problem, the present disclosure provides a method for preparing a display panel, the including steps of: providing a base layer: preparing a plurality of cofferdams on the base layer; and preparing one sub-pixel on the base layer in each of the cofferdams, wherein a geometric figure of each of the sub-pixels is in the shape of a right angle with equal sides, and geometric figures of any two sub-pixels are congruent geometric figures; in a first direction, a geometric figure obtained after any one of the sub-pixels is translated coincides with a geometric figure of a next sub-pixel adjacent to the sub-pixel: in a second direction perpendicular to the first direction, a geometric figure obtained after any one of the sub-pixels is rotated by 180° Coincides with a geometric figure of a next sub-pixel adjacent to the sub-pixel: and each of the sub-pixels includes a plurality of display regions, and a shape of an arrangement geometric figure of the display regions in any one of the sub-pixels is same as a shape of a geometric figure of the sub-pixel in which the display regions are located.

Further, a preparation step of preparing the sub-pixel in the cofferdam includes: providing an inkjet printing device, wherein the inkjet printing device includes a plurality of nozzles arranged in a third direction, and the third direction is parallel to the first direction or parallel to the second direction: moving the inkjet printing device in a fourth direction perpendicular to the third direction: and spraying ink on two display regions at a right-angle side of each of the sub-pixels parallel to the third direction, wherein the ink extends to completely cover the sub-pixel in which the display regions are located.

Beneficial Effects

The present disclosure has the advantages that a geometric figure of each sub-pixel is designed into the shape of a right angle with equal sides, so that when an arrangement direction of nozzles is parallel to any right-angle side of the sub-pixel, an inkjet printing device can perform printing, to improve adaptability between the sub-pixels and the inkjet printing device and reduce difficulty in printing of the sub-pixels, and a case that the inkjet printing device requires to be rotated when sub-pixels in different arrangement directions are printed in the prior art is avoided, thereby improving production efficiency and increasing an overall output. In the present disclosure, quantities of display regions in the sub-pixels are increased, and density of the display regions is increased, so that a resolution of the display panel is improved.

BRIEF DESCRIPTION OF DRAWINGS

To describe the technical solutions in the embodiments of the present disclosure more clearly, the following briefly describes accompanying drawings required for describing the embodiments. Apparently, the accompanying drawings in the following descriptions show merely some embodiments of the present disclosure, and a person skilled in the art may still derive other accompanying drawings from these accompanying drawings without creative efforts.

Descriptions of Numerals in the Drawings

100. Display panel;
200. Inkjet printing device:
201. Nozzle;
1. Base layer;
2. Cofferdam;
3. Sub-pixel;
4. Display region;
31. First sub-pixel;
32. Second sub-pixel;
33. Third sub-pixel;
41. First display region;
42. Second display region; and
43. Third display region.

DETAILED DESCRIPTION OF PREFERRED EMBODIMENTS

Exemplary embodiments of the present disclosure are described below with reference to the accompanying drawings of this specification, and the technical content of the present disclosure is introduced completely to a person skilled in the art, to exemplify the feasibility of the present disclosure. The technical content of the present disclosure is disclosed more clearly, to make a person skilled in the art to easier to understand the present disclosure. The present disclosure may be embodied by using a plurality of embodiments in different forms, the protection scope of the present disclosure is not limited to the embodiments mentioned in the specification, and descriptions in the following embodiments are not intended to limit the scope of the present disclosure.

The directional terms mentioned in the present disclosure, for example, "upper", "lower", "before", "after", "left", "right", "inside", "outside", and "side", merely refer to directions in the accompanying drawings, and the directional terms are only used for explaining and describing the present disclosure instead of limiting the protection scope of the present disclosure.

In the accompanying drawings, components with the same structure are represented by the same numeral, and components with similar structures or functions are represented by similar numerals. In addition, for ease of understanding and description, a size and a thickness of each component shown in the drawings are arbitrarily shown, but the size and the thickness of each component are not limited in the present disclosure.

Embodiment 1

Figure 2:
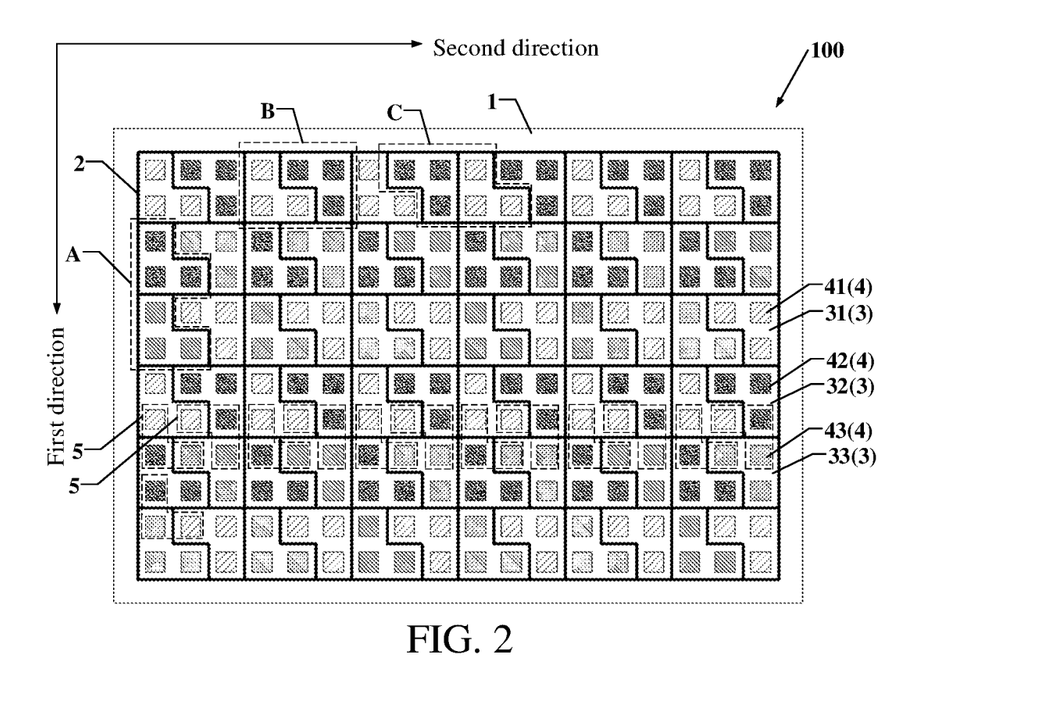
FIG. 2 is a schematic plan view of a display panel according to Embodiment 1 of the present disclosure.

As shown in FIG. 2, the present embodiment provides a display panel 100. The display panel 100 includes a base layer 1, a plurality of cofferdams 2, and a plurality of sub-pixels 3.

The base layer 1 includes film layers such as a substrate (not shown in the figure), a buffer layer (not shown in the figure), a thin film transistor layer (not shown in the figure), a planarization layer (not shown in the figure), and a plurality of pixel electrodes (not shown in the figure).

A material of the substrate is one or more of glass, polyimide, polycarbonate, polyethylene terephthalate, and polyethylene naphthalate. Therefore, the substrate may have a relatively good anti-impact capability and can effectively protect the display panel 100.

The buffer layer is disposed on the substrate. A material of the buffer layer may be SiOx or may be SiNx. The buffer layer may alternatively be a thin film with a multi-layer structure formed by SiOx and SiNx. Therefore, an anti-impact capability of the buffer layer is improved, to effectively protect the display panel 100.

The thin film transistor layer includes film layers such as an active layer, a first insulating layer, a gate layer, a second insulating layer, and a source and drain layer.

The planarization layer is disposed on a surface of a side of the thin film transistor layer away from the substrate. The planarization layer mainly provides a flat surface for a film layer on the planarization layer.

The plurality of pixel electrodes are disposed on a surface of a side of the planarization layer away from the substrate at intervals and are in a one-to-one correspondence with the sub-pixels 3.

The cofferdams 2 are disposed on the base layer 1. Specifically, the cofferdam 2 is disposed on the planarization layer between two adjacent pixel electrodes. The cofferdam 2 is mainly used for limiting a flow range of ink in the cofferdam 2, to avoid optical crosstalk between adjacent sub-pixels 3.

The plurality of sub-pixels 3 are disposed on the base layer 1 in the cofferdams 2 and are in a one-to-one correspondence with the cofferdams 2. That is, one sub-pixel 3 is disposed in each of the cofferdams 2.

As shown in FIG. 2, a geometric figure of each of the sub-pixels 3 is in the shape of a right angle with equal sides, and geometric figures of any two sub-pixels 3 are congruent geometric figures. That is, shapes and sizes of geometric figures of any two sub-pixels 3 are the same. In the present embodiment, the geometric figure of the sub-pixel 3 includes a "⌊" shape with equal side and a "⌉" shape with equal sides.

In the present embodiment, a geometric figure of each sub-pixel 3 is designed into the shape of a right angle with equal sides, so that when an arrangement direction of nozzles is parallel to any right-angle side of the sub-pixel, an inkjet printing device can perform printing, to improve adaptability between the sub-pixels 3 and the inkjet printing device and reduce difficulty in printing of the sub-pixels, and a case that the inkjet printing device requires to be rotated when sub-pixels 3 in different arrangement directions are printed in the prior art is avoided, thereby improving production efficiency and increasing an overall output.

As shown in FIG. 2, in a first direction, a geometric figure obtained after any one of the sub-pixels 3 is translated coincides with a geometric figure of a next sub-pixel 3 adjacent to the sub-pixel.

Figure 3:
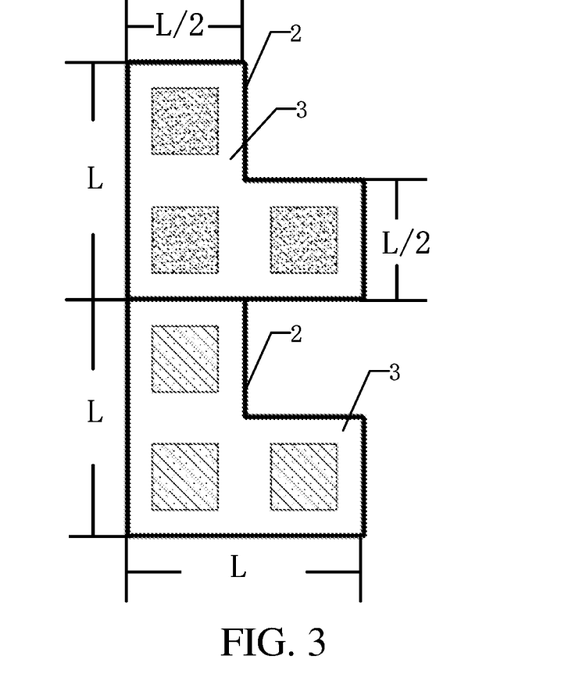
FIG. 3 is an enlarged view of a dashed-line box A in FIG. 2.

As shown in FIG. 3, in the present embodiment, lengths of two right-angle sides of the sub-pixel 3 are both L. A geometric figure obtained after one sub-pixel 3 is translated by L in the first direction coincides with a geometric figure of a next sub-pixel 3.

As shown in FIG. 2, in a second direction perpendicular to the first direction, a geometric figure obtained after any one of the sub-pixels 3 is rotated by 180° Coincides with a geometric figure of a next sub-pixel 3 adjacent to the sub-pixel. That is, in the second direction, any two adjacent sub-pixels 3 are centrosymmetric.

Figure 4:
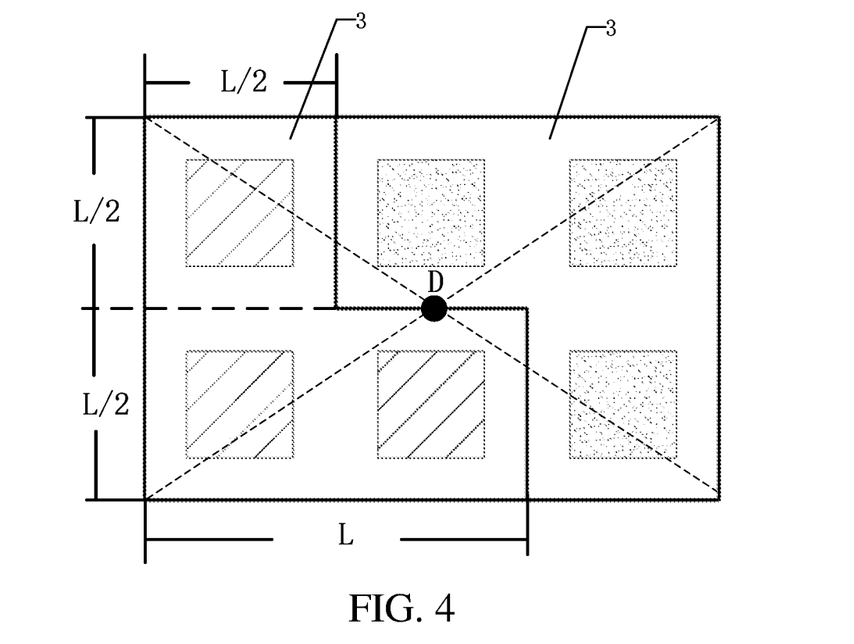
FIG. 4 is an enlarged view of a dashed-line box B in FIG. 2.

As shown in FIGS. 2 and 4, in the present embodiment, in the second direction, a geometric figure obtained after a $(2m-1)^{th}$ sub-pixel 3 is rotated by 180° around a point D coincides with a geometric figure of a $(2m)^{th}$ sub-pixel 3 adjacent to the $(2m-1)^{th}$ sub-pixel, wherein m is greater than or equal to 1 and m is an integer. The point D is an intersection between diagonal lines of a rectangle formed by splicing two sub-pixels 3.

Figure 5:
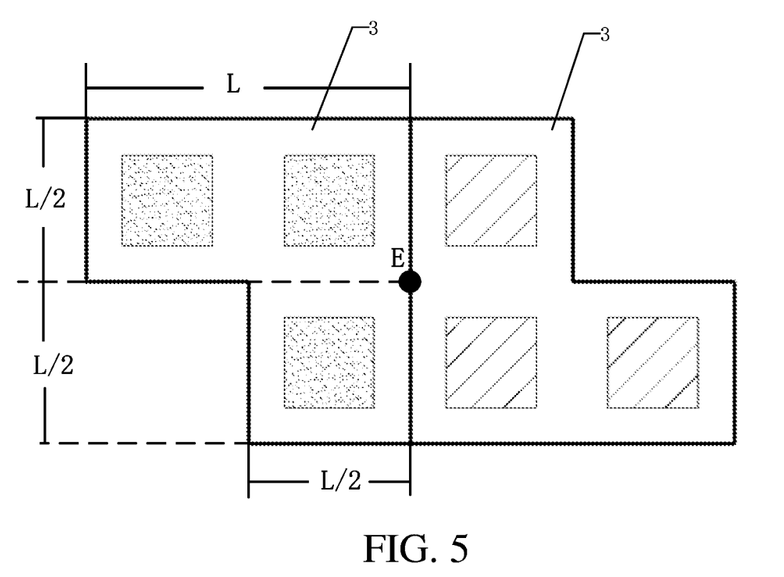
FIG. 5 is an enlarged view of a dashed-line box C in FIG. 2.

As shown in FIGS. 2 and 5, in the present embodiment, in the second direction, a geometric figure obtained after the $(2m)^{th}$ sub-pixel 3 is rotated by 180° around a point E coincides with a geometric figure of a $(2m+1)^{th}$ sub-pixel 3 adjacent to the $(2m)^{th}$ sub-pixel, wherein m is greater than or equal to 1 and m is an integer. The point E is a midpoint of a boundary line of two sub-pixels 3.

As shown in FIG. 2, each of the sub-pixels 3 includes a plurality of display regions 4. A shape of an arrangement geometric figure of the display regions 4 in any one of the sub-pixels 3 is same as a shape of a geometric figure of the sub-pixel 3 in which the display regions are located. That is, when a geometric figure of the sub-pixel 3 is a "⌊" shape" with equal sides, a plurality of display regions 4 inside the sub-pixel are also arranged into a "⌊" shape with equal sides. When a geometric figure of the sub-pixel 3 is a "⌉" shape" with equal sides, a plurality of display regions 4 inside the sub-pixel are also arranged into a "⌉" shape with equal sides.

In the present embodiment, quantities of display regions 4 in the sub-pixels 3 are increased, density of the display regions 4 is increased, and three display regions 4 can be printed by printing one sub-pixel, so that a resolution of the display panel 100 is improved.

As shown in FIG. 2, geometric figures of any two of the display regions 4 located in the same sub-pixel 3 are congruent geometric figures. Any two of the display regions 4 located in the same sub-pixel 3 have the same color.

As shown in FIG. 2, in the present embodiment, the sub-pixels 3 includes: a first sub-pixel 31, a second sub-pixel 32, and a third sub-pixel 33.

The first sub-pixel 31 includes three first display regions 41. The second sub-pixel 32 includes three second display regions 42. The third sub-pixel 33 includes three third display regions 43. Colors of the first display regions 41, the second display regions 42, and the third display regions 43 are different from each other.

The first display regions 41, the second display regions 42, and the third display regions 43 are respectively red display regions, green display regions, and blue display regions. In the present embodiment, the first display region 41 is a red display region, and the corresponding first sub-pixel 31 is a red sub-pixel. The second display region 42 is a green display region, and the corresponding second sub-pixel 32 is a green sub-pixel. The third display region 43 is a blue display region, and the corresponding third sub-pixel 33 is a blue sub-pixel.

As shown in FIG. 2, in the present embodiment, in the first direction, sub-pixels in each column are arranged in a sequence of the first sub-pixel 31, the second sub-pixel 32, and the third sub-pixel 33.

As shown in FIG. 2, in the present embodiment, in the second direction, sub-pixels in a $(3n+1)^{th}$ row are arranged in a sequence of the first sub-pixel 31 and the second sub-pixel 32. Sub-pixels in a $(3n+2)^{th}$ row are arranged in a sequence of the second sub-pixel 32 and the third sub-pixel

33. Sub-pixels in a (3n+3)$^{th}$ row are arranged in a sequence of the third sub-pixel 33 and the first sub-pixel 31. n is greater than or equal to 0 and n is an integer.

For example, when n=0, sub-pixels in a first row are arranged in a sequence of the first sub-pixel 31 and the second sub-pixel 32. Sub-pixels in a second row are arranged in a sequence of the second sub-pixel 32 and the third sub-pixel 33. Sub-pixels in a third row are arranged in a sequence of the third sub-pixel 33 and the first sub-pixel 31.

As shown in FIG. 2, one first display region 41, one second display region 42, and one third display region 43 form one valid pixel unit 5. A geometric figure of the valid pixel unit 5 is in the shape of a right angle with equal sides. In the present embodiment, the geometric figure of the sub-pixel 3 includes a "⌊" shape with equal sides and a "⌉" shape with equal sides. Therefore, in the present embodiment, the geometric figure of the valid pixel unit 5 includes a "⌊" shape with equal sides and a "⌉" shape with equal sides. In another embodiment, when the geometric figure of the sub-pixel 3 includes a "⌈" shape with equal sides and a "⌋" shape with equal sides, the geometric figure of the valid pixel unit 5 includes a "⌈" shape with equal sides and a "⌋" shape with equal sides.

Figure 6:
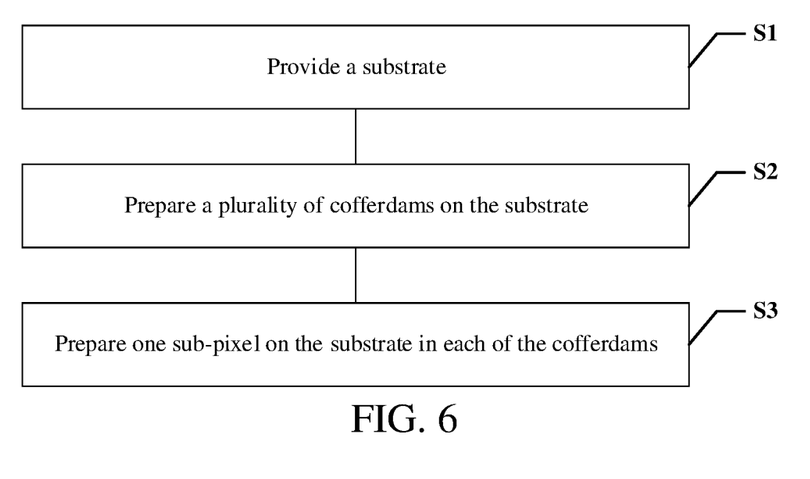
FIG. 6 is a diagram of preparation steps of a display panel according to Embodiment 1 of the present disclosure.

As shown in FIG. 6, the present embodiment further provides a method for preparing the display panel 100. The method includes steps of: S1. Provide a base layer 1. S2. Prepare a plurality of cofferdams 2 on the base layer 1. S3. Prepare one sub-pixel 3 on the base layer 1 in each of the cofferdams 2.

The base layer 1 in S1 includes film layers such as a substrate (not shown in the figure), a buffer layer (not shown in the figure), a thin film transistor layer (not shown in the figure), a planarization layer (not shown in the figure), and a plurality of pixel electrodes (not shown in the figure).

S3 further includes: providing an inkjet printing device 200, wherein the inkjet printing device 200 includes a plurality of nozzles 201 arranged in a third direction, and the third direction is parallel to the first direction or parallel to the second direction: moving the inkjet printing device 200 in a fourth direction perpendicular to the third direction: and spraying ink on two display regions 4 at a right-angle side of each of the sub-pixels 3 parallel to the third direction, wherein the ink extends to completely cover the sub-pixel 3 in which the display regions are located.

Figure 7:
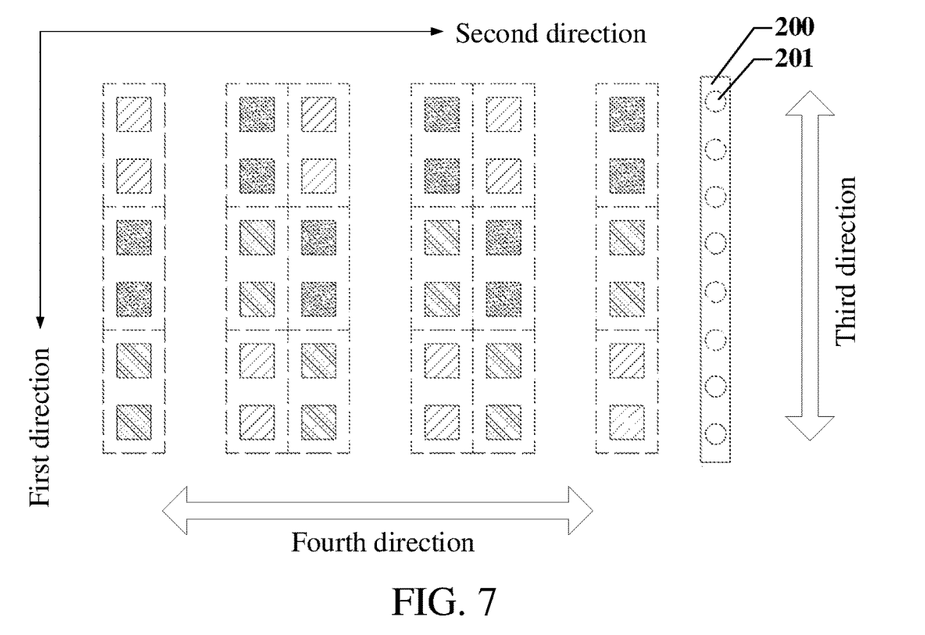
FIG. 7 is a schematic diagram of printing of display regions in sub-pixels when a third direction is parallel to a first direction according to Embodiment 1.

As shown in FIG. 7, the nozzles 201 are arranged in a third direction parallel to the first direction. The inkjet printing device 200 moves in a fourth direction parallel to the second direction. Ink is sprayed on two display regions 4 at a right-angle side of each of the sub-pixels 3 parallel to the third direction. Due to wettability of ink, the ink extends to completely cover the sub-pixel 3 in which the display regions are located.

Figure 8:
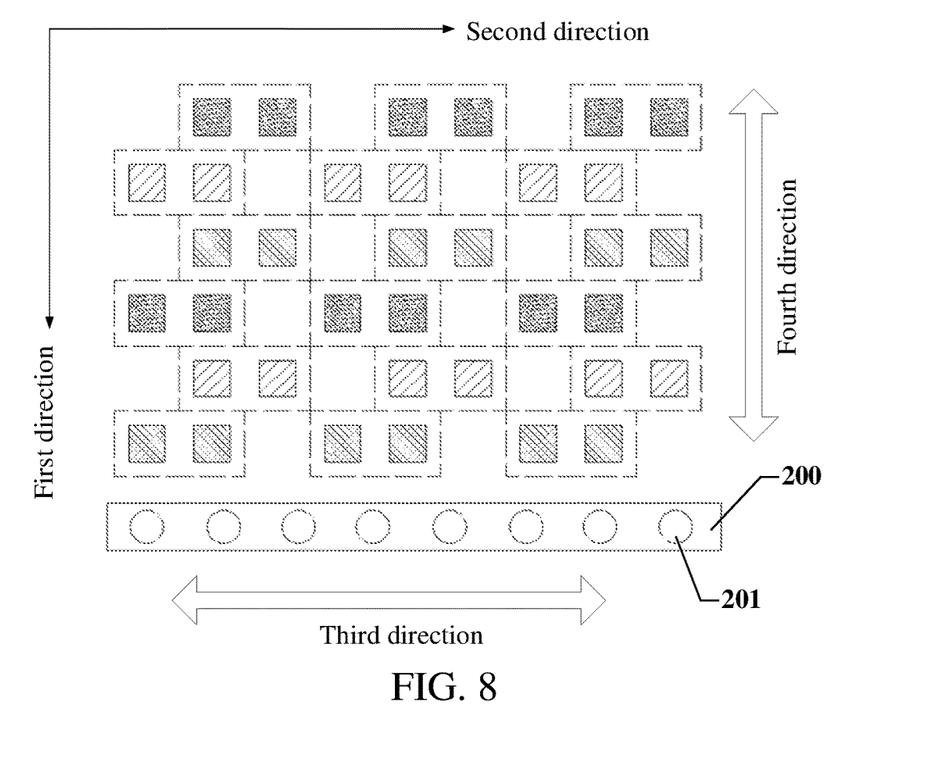
FIG. 8 is a schematic diagram of printing of display regions in sub-pixels when a third direction is parallel to a second direction according to Embodiment 1.

As shown in FIG. 8, the nozzles 201 are arranged in a third direction parallel to the second direction. The inkjet printing device 200 moves in a fourth direction parallel to the first direction. Ink is sprayed on two display regions 4 at a right-angle side of each of the sub-pixels 3 parallel to the third direction. Due to wettability of ink, the ink extends to completely cover the sub-pixel 3 in which the display regions are located.

Based on the foregoing, in the present embodiment, a geometric figure of each sub-pixel 3 is designed into the shape of a right angle with equal sides, so that when an arrangement direction of nozzles is parallel to any right-angle side of the sub-pixel 3, an inkjet printing device 200 can perform printing, to improve adaptability between the sub-pixels 3 and the inkjet printing device 200 and reduce difficulty in printing of the sub-pixels 3, and a case that the inkjet printing device 200 requires to be rotated when sub-pixels 3 in different arrangement directions are printed in the prior art is avoided, thereby improving production efficiency and increasing an overall output. In the present disclosure, quantities of display regions 4 in the sub-pixels 3 are increased, and density of the display regions 4 is increased, so that a resolution of the display panel 100 is improved.

Embodiment 2

Figure 9:
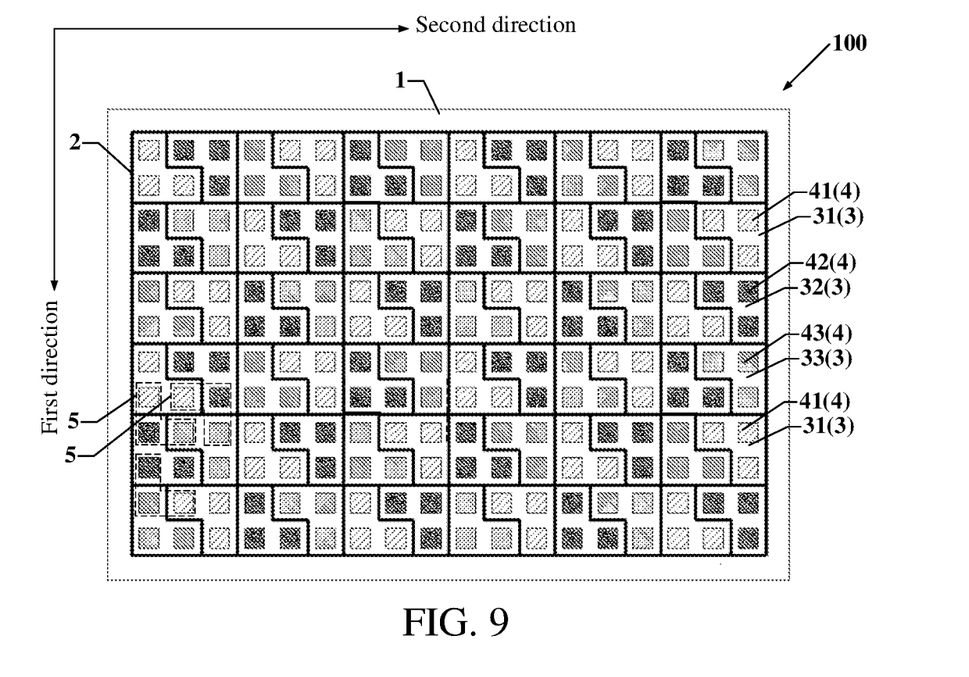
FIG. 9 is a schematic plan view of a display panel according to Embodiment 2 of the present disclosure.

As shown in FIG. 9, the present embodiment includes most technical features of Embodiment 1. A difference between the present embodiment and Embodiment 1 lies in that: in Embodiment 2, in the first direction, sub-pixels in each column are arranged in a sequence of the first sub-pixel 31, the second sub-pixel 32, and the third sub-pixel 33. In the second direction, sub-pixels in each row are arranged in a sequence of the first sub-pixel 31, the second sub-pixel 32, and the third sub-pixel 33.

Figure 10:
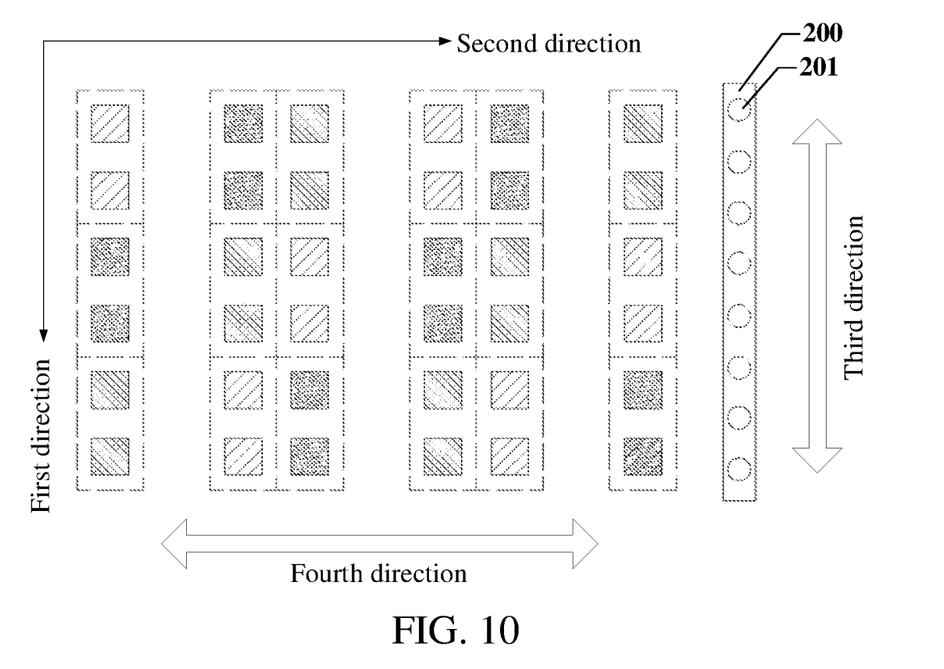
FIG. 10 is a schematic diagram of printing of display regions in sub-pixels when a third direction is parallel to a first direction according to Embodiment 2.

As shown in FIG. 10, the nozzles 201 are arranged in a third direction parallel to the first direction. The inkjet printing device 200 moves in a fourth direction parallel to the second direction. Ink is sprayed on two display regions 4 at a right-angle side of each of the sub-pixels 3 parallel to the third direction. Due to wettability of ink, the ink extends to completely cover the sub-pixel 3 in which the display regions are located.

Figure 11:
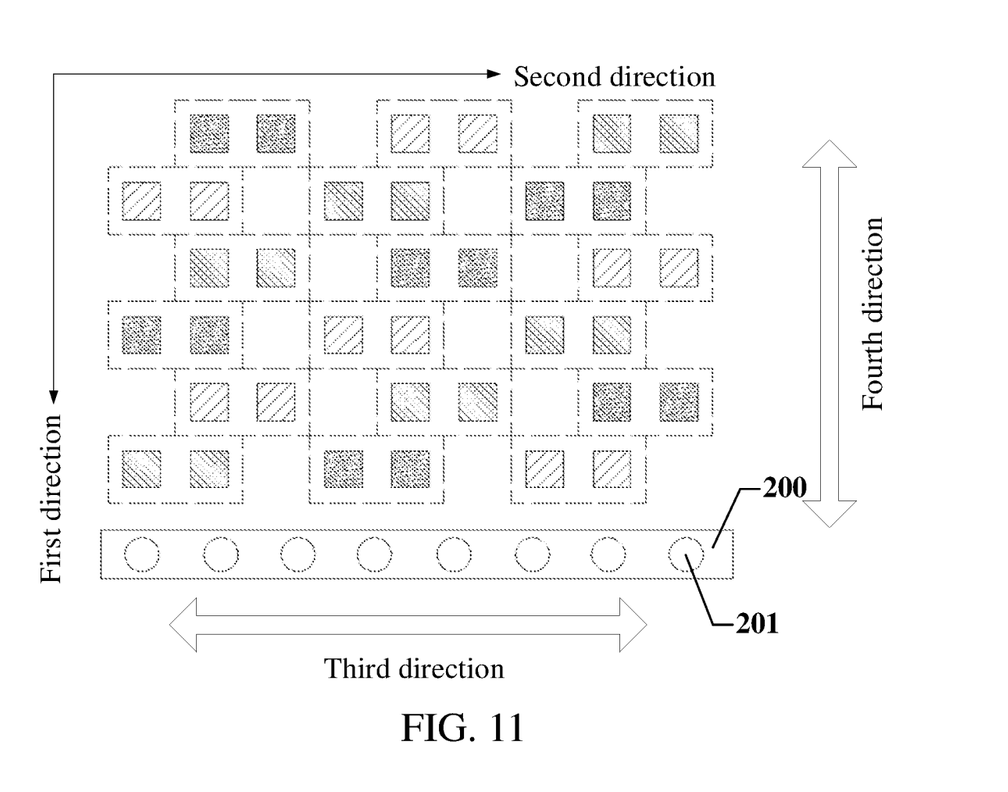
FIG. 11 is a schematic diagram of printing of display regions in sub-pixels when a third direction is parallel to a second direction according to Embodiment 2.

As shown in FIG. 11, the nozzles 201 are arranged in a third direction parallel to the second direction. The inkjet printing device 200 moves in a fourth direction parallel to the first direction. Ink is sprayed on two display regions 4 at a right-angle side of each of the sub-pixels 3 parallel to the third direction. Due to wettability of ink, the ink extends to completely cover the sub-pixel 3 in which the display regions are located.

Based on the foregoing, in the present embodiment, a geometric figure of each sub-pixel 3 is designed into the shape of a right angle with equal sides, so that when an arrangement direction of nozzles is parallel to any right-angle side of the sub-pixel 3, an inkjet printing device 200 can perform printing, to improve adaptability between the sub-pixels 3 and the inkjet printing device 200 and reduce difficulty in printing of the sub-pixels 3, and a case that the inkjet printing device 200 requires to be rotated when sub-pixels 3 in different arrangement directions are printed in the prior art is avoided, thereby improving production efficiency and increasing an overall output. In the present disclosure, quantities of display regions 4 in the sub-pixels 3 are increased, and density of the display regions 4 is increased, so that a resolution of the display panel 100 is improved.

The display panel and the method for preparing the same provided in the present disclosure are described in detail above. The principles and implementations of the present disclosure are described through specific examples in this specification, and the descriptions of the embodiments are only intended to help understand the methods and core ideas of the present disclosure. Meanwhile, a person of ordinary skill in the art may make modifications to the specific implementations and application scopes according to the ideas of the present disclosure. In conclusion, the content of the specification should not be construed as a limitation to the present disclosure.

What is claimed is:

1. A display panel, comprising:
   a base layer;
   a plurality of dams, disposed on the base layer; and
   a plurality of sub-pixels, disposed on the base layer in the dams and being in a one-to-one correspondence with the dams, wherein geometric figures of any two sub-pixels are congruent geometric figures;
   in a first direction, a geometric figure obtained after any one of the sub-pixels is translated coincides with a geometric figure of a next sub-pixel adjacent to the sub-pixel;
   in a second direction perpendicular to the first direction, a geometric figure obtained after any one of the sub-pixels is rotated by 180° coincides with a geometric figure of a next sub-pixel adjacent to the sub-pixel; and
   each of the sub-pixels comprises a plurality of display regions, and a shape of an arrangement for the display regions in any one of the sub-pixels is same as a shape of a geometric figure of the sub-pixel in which the display regions are located;
   wherein the sub-pixels comprise:
   a plurality of first sub-pixels, each of the first sub-pixels comprising three first display regions;
   a plurality of second sub-pixels, each of the second sub-pixels comprising three second display regions; and
   a plurality of third sub-pixels, each of the third sub-pixels comprising three third display regions; and
   colors of the first display regions, the second display regions, and the third display regions are different from each other;
   wherein the geometric figure of each of the sub-pixels comprises a "[" shape with equal sides or a "]" shape with equal sides.

2. The display panel as claimed in claim 1, wherein geometric figures of any two of the display regions located in the same sub-pixel are congruent geometric figures.

3. The display panel as claimed in claim 2, wherein any two of the display regions located in the same sub-pixel have the same color.

4. The display panel as claimed in claim 1, wherein the first display regions, the second display regions, and the third display regions are respectively red display regions, green display regions, and blue display regions.

5. The display panel as claimed in claim 1, wherein
   in the first direction, sub-pixels in each column are arranged in a sequence of the first sub-pixel, the second sub-pixel, and the third sub-pixel; and
   in the second direction, sub-pixels in a (3n+1) throw are arranged in a sequence of the first sub-pixel and the second sub-pixel, sub-pixels in a (3n+2) throw are arranged in a sequence of the second sub-pixel and the third sub-pixel, and sub-pixels in a (3n+3) throw are arranged in a sequence of the third sub-pixel and the first sub-pixel, wherein n is greater than or equal to 0 and n is an integer.

6. The display panel as claimed in claim 5, wherein one first display region, one second display region, and one third display region form one effective pixel unit, and a geometric figure of the effective pixel unit comprises a "[" shape with equal sides or a "]" shape with equal sides.

7. The display panel as claimed in claim 1, wherein
   in the first direction, sub-pixels in each column are arranged in a sequence of the first sub-pixel, the second sub-pixel, and the third sub-pixel; and
   in the second direction, sub-pixels in each row are arranged in a sequence of the first sub-pixel, the second sub-pixel, and the third sub-pixel.

8. The display panel as claimed in claim 7, wherein one first display region, one second display region, and one third display region form one effective pixel unit, and a geometric figure of the effective pixel unit comprises a "[" shape with equal sides or a "]" shape with equal sides.

9. A method for preparing a display panel, comprising following steps:
   providing a base layer;
   preparing a plurality of dams on the base layer; and
   preparing one sub-pixel on the base layer in each of the dams, wherein geometric figures of any two sub-pixels are congruent geometric figures; in a first direction, a geometric figure obtained after any one of the sub-pixels is translated coincides with a geometric figure of a next sub-pixel adjacent to the sub-pixel; in a second direction perpendicular to the first direction, a geometric figure obtained after any one of the sub-pixels is rotated by 180° coincides with a geometric figure of a next sub-pixel adjacent to the sub-pixel; and each of the sub-pixels comprises a plurality of display regions, and a shape of an arrangement for the display regions in any one of the sub-pixels is same as a shape of a geometric figure of the sub-pixel in which the display regions are located;
   wherein the sub-pixels comprise:
   a plurality of first sub-pixels, each of the first sub-pixels comprising three first display regions;
   a plurality of second sub-pixel, each of the second sub-pixels comprising three second display regions; and
   a plurality of third sub-pixel, each of the third sub-pixels comprising three third display regions; and
   colors of the first display regions, the second display regions, and the third display regions are different from each other;
   wherein the geometric figure of each of the sub-pixels comprises a "[" shape with equal side or a "]" shape with equal sides.

10. The method for preparing a display panel as claimed in claim 9, wherein a preparation step of preparing one of the sub-pixels in the dam comprises:
    providing an inkjet printing device, wherein the inkjet printing device comprises a plurality of nozzles arranged in a third direction, wherein the third direction is parallel to the first direction or parallel to the second direction;
    moving the inkjet printing device in a fourth direction perpendicular to the third direction; and
    spraying ink on two display regions at a right-angle side of each of the sub-pixels parallel to the third direction, wherein the ink extends to completely cover one of the sub-pixels in which the display regions are located.

* * * * *